Dec. 3, 1968 J. O. MOORE 3,414,783

ELECTRONIC APPARATUS FOR HIGH SPEED TRANSISTOR SWITCHING

Filed March 14, 1966

WITNESSES:

Bernard R. Gregory

James F. Young

INVENTOR
James O. Moore
BY
Gordon H. Telfer
ATTORNEY

United States Patent Office 3,414,783

Patented Dec. 3, 1968

3,414,783

ELECTRONIC APPARATUS FOR HIGH SPEED TRANSISTOR SWITCHING

James O. Moore, Elkridge, Md., assignor to Westinghouse Electric Corporation, Pittsburgh, Pa., a corporation of Pennsylvania Filed Mar. 14, 1966, Ser. No. 534,153

4 Claims. (Cl. 317—235)

ABSTRACT OF THE DISCLOSURE

A transistor switching circuit is provided including two serially connected transistors of which the first has a diode connected across its base and emitter for increased charge storage capability and improvement of the switching characteristics of the second transistor.

Figure 1:
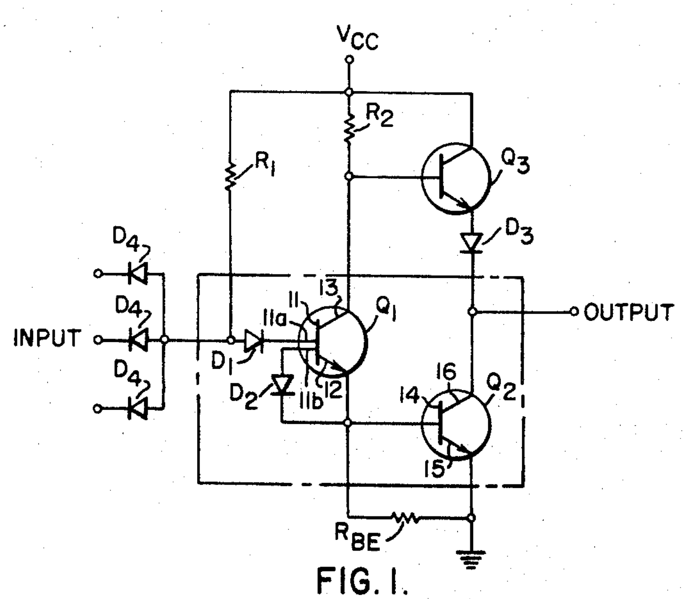

This application is directed to electronic apparatus utilizing a transistor for performing switching functions at high speed, particularly in integrated circuits.

In transistor switching applications, including logic gates such as DTL and TTL circuits, the switching speed of the switching transistor is affected by other elements in the circuit, particularly those in series with it. These elements should be capable of removing all the charge stored in the transistor when turned on in order to achieve rapid turn off. For example, if insufficient charge can be stored in the series diode connected to the transistor base in DTL circuits, excess charge will be left in the transistor base and collector regions upon switching from on to off. High series impedance in the series diode limits the rate at which this charge can be removed. Some improvement has been achieved using a diode structure of particular construction to improve its charge storage capability as taught in copending application Ser. No. 379,961, filed July 2, 1964, by Pollock et al. and assigned to the assignee of this invention.

The foregoing solution applied to a particular circuit may still leave a problem in another element. This is so, for example, in a logic gate with bidirectional output in which the switching speed of an output transistor is limited by the charge storage capability of a previous transistor.

Many circuits, including logic gates, are now being successfully fabricated in integrated circuit form and use of components external to the integrated circuit is undesirable for size, weight and cost reasons. Hence, any solution to the foregoing charge storage problem should be amenable to application by integrated circuit techniques.

It is, therefore, an object of the present invention to provide improved means for reducing adverse charge storage effects in transistor switching circuits.

Another object is to provide improved electronic apparatus for high speed transistor switching which may be readily incorporated in integrated circuits.

Another object is to provide an improved semiconductor integrated circuit structure for improving the switching speed of transistor circuits with bidirectional output.

The invention, briefly, achieves the above-mentioned and additional objects and advantages by providing electronic apparatus that includes a first transistor with a diode connected across the base and emitter regions of the transistor and poled so that the direction of positive current flow is away from the base. The diode serves to speed up charge removal from the base of a subsequent transistor in the circuit while operating in the switching mode.

Preferably the regions of the diode have a high effective carrier lifetime to facilitate the charge removal process as may be provided by the structure disclosed in the referred to copending application. As described therein, a diode is provided in the structure having regions of greater impurity concentration than the emitter and base regions of the transistor structure, one region of the diode being formed during the diffusion of the isolation walls in the conventional integrated circuit fabrication process.

In accordance with another aspect of the invention, the referred to diode is connected to a different base contact of the transistor than that to which other circuit elements are connected.

Figure 2:
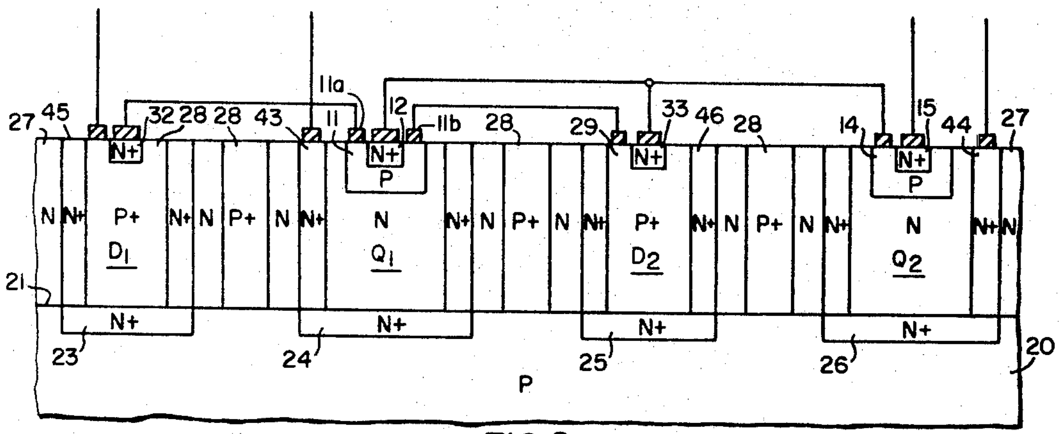

The invention, together with the above-mentioned and additional objects and advantages thereof will be better understood by referring to the following description, taken with the accompanying drawing wherein:

FIGURE 1 is a circuit schematic of one circuit embodying the present invention; and FIGURE 2 is a partial cross-section view of a semiconductor integrated circuit embodying that portion of the circuit of FIGURE 1 that is enclosed by the dashed-line.

Referring to FIGURE 1, particularly that portion enclosed by the dashed-line, the electronic apparatus in accordance with the present invention is illustrated by a transistor $Q_1$ having base, emitter and collector regions 11, 12 and 13, respectively. To the base 11 of transistor $Q_1$ is connected a first diode $D_1$, although there may be more than one in a series connection, poled so that the direction of positive current flow therethrough is towards the base region. $D_1$ is for the known purpose of establishing a threshold switching level in the transistor. Transistor $Q_2$, having base, emitter and collector regions 14, 15 and 16, respectively, has its base 14 connected to the emitter 12 of $Q_1$. For optimum performance all elements in the circuit prior to $Q_2$ should be capable of greater charge storage than $Q_2$. Normally $Q_1$ stores less charge than $Q_2$.

In accordance with this invention, however, the problem of charge storage is considerably alleviated by employing a second diode $D_2$ connected between the base and emitter regions 11 and 12, respectively, of the transistor $Q_1$ and poled so that the direction of positive current flow therethrough is away from the base region 11. The combination of $Q_1$ and $D_2$, insofar as $Q_2$ is concerned, appears as a single element that can store more charge than $Q_2$ can.

While $D_2$ is connected to base region 11 as is diode $D_1$ it should preferably be connected to a different contact on the transistor base region 11 to avoid shorting the transistor. Hence, the two indicated base connections 11*a* and 11*b* are provided to transistor base 11. The transistor may otherwise be conventional. It has also been found that the use of the two base contacts 11*a* and 11*b* is critical for eliminating transient supply current spikes during turn off.

The circuit of FIG. 1, other than for the presence of diode $D_2$, is well known and will not be extensively described herein. The diodes $D_4$ will be recognized to constitute a typical gate which with the inversion qualities of transistor $Q_1$ provide NAND/NOR functions. The resistors $R_1$ and $R_2$ are provided to establish operating points of the transistors in well known manner. $Q_2$ and $Q_3$ are, as mentioned, for bidirectional output with diode $D_3$ to provide coupling between the outputs of the two transistors. $R_{BE}$ is required in order to give a sharp transfer characteristic.

Some of the problems with this type of circuit that are consequences of the charge storage problem in $Q_2$ are that because of the current gain of $Q_1$, the charge of $Q_2$ is always greater than that of $Q_1$. Thus, without $D_2$, complete charge removal is impossible and long turnoff times result. Additionally, supply current spikes result from $Q_2$ being in saturation while $Q_3$ is turning on. With $D_2$ present, the effective stored charge in $Q_1$ is increased so as to equal the value stored in $Q_2$. The ratio of the $Q_1$ base current to shunt diode current is controlled by the emitter base geometry of $Q_1$. The lateral resistance between the two base contacts 11*a* and 11*b*, which should straddle the emitter, allows the emitter edge nearest the first base contact 11*a* to inject effectively during turn on while during turn off the emitter edge nearest the second base contact will be injecting. This will tend to keep $Q_1$ on until the excess charge is removed from $Q_2$, thus eliminating high transient current spikes due to $Q_3$ turning on prematurely.

$D_2$ may be a conventional diode, that is to say it may have the same essential structure as the emitter and base regions of a transistor structure and provide some improvement. However, it is much preferred that the regions of $D_2$ (as well as $D_1$) have a higher effective carrier lifetime than would be so provided in order to facilitate charge storage. In providing the circuit of FIG. 1 with individual components there would be relatively little difficulty in selecting such individual components to provide high speed switching with minimal storage effects or problems. However, circuits such as that of FIG. 1 are now less economical or desirable when made of conventional individual components and they have previously, with the exception of diode $D_2$, been successfully fabricated in integrated circuits. Any solution to the charge storage problem should, preferably, not require any additional external components.

Consequently, it would be desirable if the diode $D_2$ could be formed the same as the diode $D_1$. Accordingly, it is preferred that both $D_1$ and $D_2$ both be diode structure as disclosed in the referred to copending application Ser. No. 379,961 which should be referred to for further details.

FIGURE 2 is illustrative of an integrated circuit structure to provide the functions of the elements enclosed within the dashed-line of FIG. 1 and employing the teachings of the referred to copending application.

The integrated circuit structure comprises a substrate 20 of P type semiconductive material such as silicon doped with boron and having a resistivity in the range of about 5 to 40 ohm centimeters and a thickness of about 8 mils. Into the surface 21 of the substrate there are formed by diffusion regions 23, 24, 25 and 26 with a donor impurity such as phosphorus to a sheet resistivity of approximately 20 ohms per square and a depth of about 3 microns.

Over the surface 21 is then grown an epitaxial layer 27 of N type conductivity such as by the thermal reduction of silicon tetrachloride by hydrogen with a phosphorus impurity included in reactants to provide a resistivity of about 0.4 ohm centimeter in a layer having a thickness of about 10 microns.

A diffusion, performed using conventional photo-lithographic and oxide masking techniques, is performed to produce the P+ isolation walls 28 through the layer 27 to provide isolation between adjacent elements and also to provide the P+ regions 28 and 29 that serve as the anodes of diode $D_1$ and $D_2$ respectively. This diffusion may be performed using boron as the impurity to a surface concentration of about $10^{20}$ atoms per cc. and a sheet resistivity of about 5 ohms per square and is at least sufficient so that the diffusion front extends through the layer 27.

Subsequently, a diffusion of acceptor impurities such as boron is performed to produce the base regions 11 and 14 of transistors $Q_1$ and $Q_2$, respectively.

N+ walls 43 and 44 are diffused to provide a low resistance connection to the region 23 in the transistor structures $Q_1$ and $Q_2$ for low collector saturation resistance and similar walls 45 and 46 to enclose the regions 28 and 29 of the diodes $D_1$ and $D_2$ because this has been found successful in minimizing the effects of gold doping in the P+ regions 28 and 29. The walls 43, 44, 45 and 46 may be simultaneously formed during the fabrication process by known diffusion techniques such as those described in the referred to copending application. Additionally, an N-type diffusion is performed to produce the emitters 12 and 15 of transistors $Q_1$ and $Q_2$ and the cathode regions 32 and 33 respectively of diodes $D_1$ and $D_2$. These latter diffusions may be performed using the same conventional techniques as are used in the art. Contacts are provided on the various regions and interconnected as illustrated to provide the elemental circuit within the dashed-line of FIG. 1. The contacts include two base contacts 11*a* and 11*b* on $Q_1$.

It will be apparent that the inventive combination may be formed in other ways and with other materials and techniques however, that illustrated is in accordance with the preferred practice because it is most readily performed in accordance with present technology.

Diode $D_1$ is included in the exemplary structure of FIG. 2 to illustrate the ease with which the present invention utilizing $D_2$ may be incorporated in integrated form by known techniques. It will be recognized however that $D_1$ may be eliminated as it is for the purpose of setting a threshold switching level and if less noise immunity can be tolerated, $D_1$ is not necessary. It is also suitable for $D_1$ and the input diodes to be replaced by a multi-emitter transistor in what is sometimes referred to as a TTL (Transistor Transistor Logic) circuit as opposed to the DTL (Diode Transistor Logic) circuit that is illustrated.

In integrating circuits like that illustrated turn off time has been reduced by 50% and the transient current spike has been completely eliminated whereas previously it was ten to fifteen times the supply current. Typically, the reduction in turn off time was from about 27 nanoseconds to about 16 nanoseconds while the transient was reduced from about 40 milliamperes peak to zero, essentially.

While the present invention has been shown and described in a few forms, only, it will be understood that various changes may be made without departing from the spirit and scope thereof.

What is claimed is:

1. Electronic apparatus comprising: a first transistor having base, emitter and collector regions; means connected to the base of said first transistor for establishing the threshold switching level of said first transistor; a diode connected across the base and emitter regions of said first transistor and poled so that the diode region connected to the base region is of the same conductivity type as that region; a second transistor having base, emitter and collector regions with the base region of said second transistor electrically coupled to the emitter region of said first transistor, said diode serving to speed up charge removal from said second transistor.

2. Electronic apparatus in accordance with claim 1 wherein said diode is a semiconductive diode with regions having a greater impurity concentration and a higher effective carrier lifetime than the emitter and base regions of said first and second transistors.

3. Electric apparatus in accordance with claim 1 wherein: said first and second transistors and said diode are united in a unitary body of semiconductor material with said first transistor having two spaced ohmic contacts on its base region only a first of which is connected to said diode.

4. Electronic apparatus in accordance with claim 3 further comprising: a second diode electrically coupled to the second of said ohmic contacts on said base region of said first transistor and poled so that the region of said second diode connected to said ohmic contact is of opposite conductivity type with respect to said transistor base region; said emitter region of said first transistor having an ohmic contact thereon located between said two spaced ohmic contacts on said base region.

References Cited

UNITED STATES PATENTS 3,259,761 7/1966 Narud ------------ 307—88.5

JOHN W. HUCKERT, *Primary Examiner.*

M. H. EDLOW, *Assistant Examiner.*